US011404310B2

(12) United States Patent
Pokornowski et al.

(10) Patent No.: US 11,404,310 B2
(45) Date of Patent: Aug. 2, 2022

(54) GOLD PLATING ON METAL LAYER FOR BACKSIDE CONNECTION ACCESS

(71) Applicant: Hutchinson Technology Incorporated, Hutchinson, MN (US)

(72) Inventors: Zachary A. Pokornowski, Cokato, MN (US); Ronald A. Greeley, Winsted, MN (US); Terry W. Zeller, Chaska, MN (US); Jeffery G. Ribar, Brownton, MN (US); Joel B. Michaletz, Litchfield, MN (US); John A. Theget, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 16/394,521

(22) Filed: Apr. 25, 2019

(65) Prior Publication Data
US 2019/0341293 A1 Nov. 7, 2019

Related U.S. Application Data

(60) Provisional application No. 62/665,239, filed on May 1, 2018.

(51) Int. Cl.
*H01L 23/532* (2006.01)
*H01L 21/768* (2006.01)

(52) U.S. Cl.
CPC .... *H01L 21/7685* (2013.01); *H01L 23/53252* (2013.01)

(58) Field of Classification Search
CPC .............. H01L 23/53252; H01L 21/7685
See application file for complete search history.

(56) References Cited

U.S. PATENT DOCUMENTS

| | | | |
|---|---|---|---|
| 6,368,964 B1 * | 4/2002 | Hsu | H01L 21/76888 438/672 |
| 6,475,907 B1 * | 11/2002 | Taguwa | H01L 21/76843 257/E21.591 |
| 9,640,497 B1 * | 5/2017 | Lin | H01L 24/05 |
| 10,504,861 B2 * | 12/2019 | Moriyama | H01L 23/5226 |
| 2006/0019490 A1 * | 1/2006 | Chou | H01L 24/11 438/637 |
| 2007/0190692 A1 * | 8/2007 | Erturk | H01L 21/76898 438/118 |
| 2009/0289342 A1 * | 11/2009 | Kasuya | H05K 3/403 257/690 |
| 2010/0304298 A1 * | 12/2010 | Hirashima | G03F 7/38 430/270.1 |
| 2011/0198114 A1 * | 8/2011 | Maeda | H01L 23/49811 174/257 |
| 2013/0270703 A1 * | 10/2013 | Zierath | H01L 21/76879 257/751 |
| 2014/0077374 A1 * | 3/2014 | Lin | H01L 23/481 257/741 |
| 2015/0315708 A1 * | 11/2015 | Radi | H01L 23/5223 428/596 |

(Continued)

*Primary Examiner* — Nathan W Ha
(74) *Attorney, Agent, or Firm* — DLA Piper LLP (US)

(57) ABSTRACT

A backside connection access structure and method for manufacturing are described. The method including forming a gold layer over at least a portion of a substrate. The method also including forming a metal layer over the gold layer. And, the method includes forming an opening in the substrate to expose at least a portion of the gold layer.

5 Claims, 7 Drawing Sheets

(56) References Cited

U.S. PATENT DOCUMENTS

| | | | |
|---|---|---|---|
| 2016/0028367 A1* | 1/2016 | Shealy | H03H 9/174 |
| | | | 310/321 |
| 2016/0379947 A1* | 12/2016 | Schneegans | H01L 29/45 |
| | | | 257/737 |
| 2017/0338148 A1* | 11/2017 | Shusterman | H01L 23/53223 |
| 2018/0132348 A1* | 5/2018 | Berkel | H05K 3/4644 |
| 2018/0166568 A1* | 6/2018 | Samra | H01L 23/5226 |
| 2018/0218937 A1* | 8/2018 | Van Der Wiel | H01L 23/53252 |
| 2018/0218984 A1* | 8/2018 | Van Der Wiel | H01L 23/5226 |
| 2019/0006230 A1* | 1/2019 | Kuo | H01L 23/5226 |
| 2019/0148306 A1* | 5/2019 | Lin | H01L 29/861 |
| | | | 438/530 |
| 2019/0164824 A1* | 5/2019 | Wang | H01L 21/76865 |
| 2019/0363037 A1* | 11/2019 | Kume | H01L 21/76871 |

* cited by examiner

Figure 2b (optional)

Figure 3b (optional)

Figure 4b (optional)

GOLD PLATING ON METAL LAYER FOR BACKSIDE CONNECTION ACCESS

CROSS-REFERENCE TO RELATED APPLICATIONS

This application claims priority from U.S. Provisional Patent Application No. 62/665,239, filed on May 1, 2018, which is hereby incorporated by reference in its entirety.

FIELD

Embodiments of the invention relate to electrical connections. In particular, embodiments of the invention relate generally to backside access for electrical connections.

BACKGROUND

Manufacturing of devices including electrical traces requires access to the electrical trace to electrically couple the traces to one or more electrical circuits or components. There remains a continuing need for enhanced circuit structures to provide access to the electrical traces of devices. There is also a continuing need for efficient and effective processes for manufacturing circuits and other structures.

SUMMARY

A backside connection access structure and method for manufacturing are described. The method including forming a gold layer over at least a portion of a substrate. The method also including forming a metal layer over the gold layer. And, the method includes forming an opening in the substrate to expose at least a portion of the gold layer.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which:

FIGS. 2a-g illustrates a process for forming a backside connection access structure according to an embodiment;

FIGS. 3a-g illustrates a process for forming a backside connection access structure by forming a dielectric layer before a gold layer according to an embodiment; and FIGS. 4a-h illustrates a process for forming a backside connection access structure including a barrier layer according to an embodiment.

DETAILED DESCRIPTION

A backside connection access and methods of manufacturing in accordance with embodiments of the invention are described. The backside connection access is configured to provide electrical contact to one or more of any of electrical traces and contacts. The backside connection access includes a gold layer between a substrate and the metal layer. The metal layer can be formed as a trace or a contact. An opening is formed in the substrate that provides access to the gold layer and the metal layer for forming an electrical connection with the metal layer. The gold layer enables the use of additive and subtractive manufacturing processes similar to those used to form the one or more of any of a metal layer, a dielectric layer, a covercoat layer, or other layer or structure of a device.

The structure including a gold layer between a substrate and the metal layer removes the need to use methods, such as laser ablation, to form an opening to create the backside connection access in a device that must be performed as an independent step separate from the additive and subtractive processes used to form the structure or layers of a device. Further, the gold layer enables the use of a single etch feature as to create backside connection access. The backside connection access structure provides the surfaces of the metal layer to be in the same plane as the dielectric side of a substrate. Moreover, the use of similar additive and subtractive processes to form the opening that are used to form other layers of the device, provides cost and efficiency advantages. The backside connection access structure and method for forming the backside connection access structure enables the structure to be used for different products and devices for example, suspension assemblies, medical devices, optical image stabilizer assembly, camera lens suspension, and other electro-mechanical devices.

Figure 1:
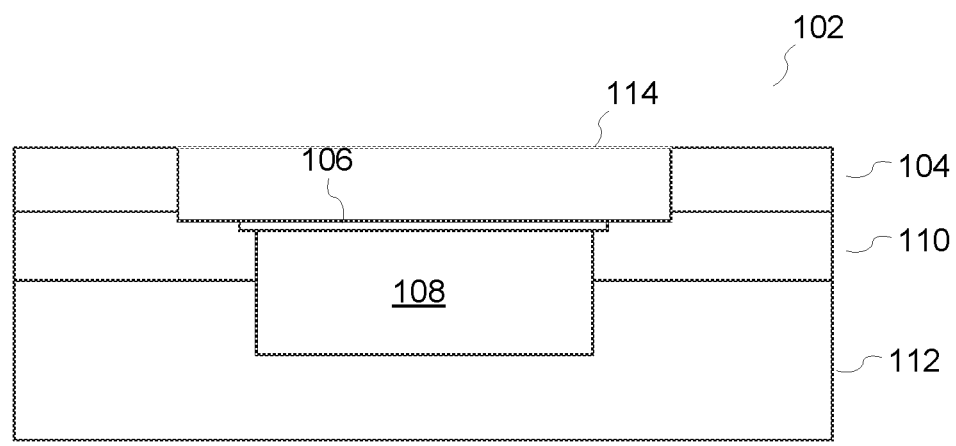
FIG. 1 illustrates a backside connection access structure according to an embodiment.

FIG. 1 illustrates a backside connection access structure according to an embodiment. The backside connection access structure 102 includes a substrate 104 with a gold layer 106 formed between the substrate and a metal layer 108. For some embodiments, the substrate 104 is a stainless steel layer. The backside connection access structure also includes a dielectric layer 110 and a covercoat layer 112. For some embodiments, the dielectric layer 110 is a polyimide layer. The covercoat layer 112, according to some embodiments, is a polyimide layer. An opening 114 in the substrate 104 provides backside access to at least a portion of the gold layer 106. The opening 114 can be used to make an electrical connection with the metal layer 108. The metal layer 108 can include one or more of any of electrical traces and contact pads. The metal layer 108 can be formed of copper, aluminum, alloys, and other metals, such as those known in the art.

Figure 2A:
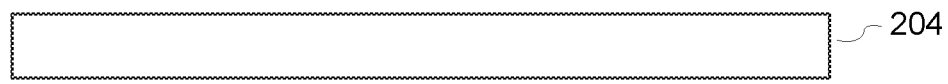

FIGS. 2a-g illustrates a process for forming a backside connection access structure according to an embodiment. A substrate 204 is cleaned as illustrated in FIG. 2a. For example, the substrate is cleaned using a plasma cleaning process. The substrate, according to some embodiments, is a metal used as a base layer. The metal includes, but is not limited to, stainless steel, copper, aluminum, alloys, and other metals. As illustrated in FIG. 2b, an optional strike layer 206 is formed on the substrate 204. The strike layer 206 is a nickel layer, according to some embodiments, used to improve the adhesion of a gold layer 208 to the substrate 204. The strike layer 206 is formed on the substrate 204 using methods known in the art including, but not limited to, electroplating, sputtering, and electroless plating.

Figure 2C:
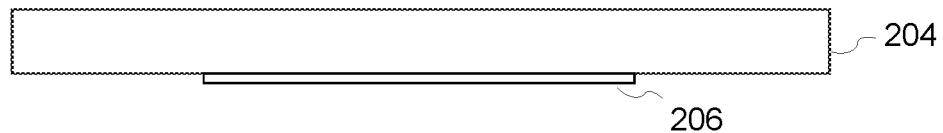
Figure 2C:
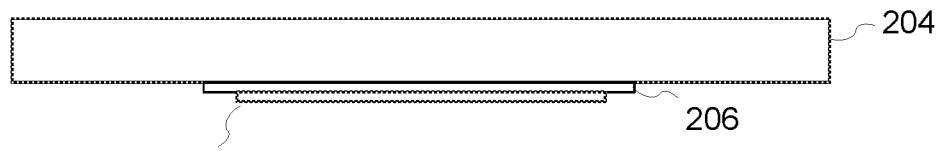

As illustrated in FIG. 2c, a gold layer 208 is formed on the strike layer 206 disposed on the substrate 204. For embodiments without a strike layer 206, the gold layer 208 is formed on the substrate 204. The gold layer 208 is formed on the substrate 204 using methods known in the art including, but not limited to, electroplating. The gold layer 208 and optionally the strike layer 206, according to some embodiments, are formed to be disposed on one or more locations on the substrate 204. Thus, the gold layer 208 and optionally the strike layer 206 are formed on the substrate in a pattern so gold and optionally the strike is located on the substrate 204 where backside access is desired.

Figure 2D:
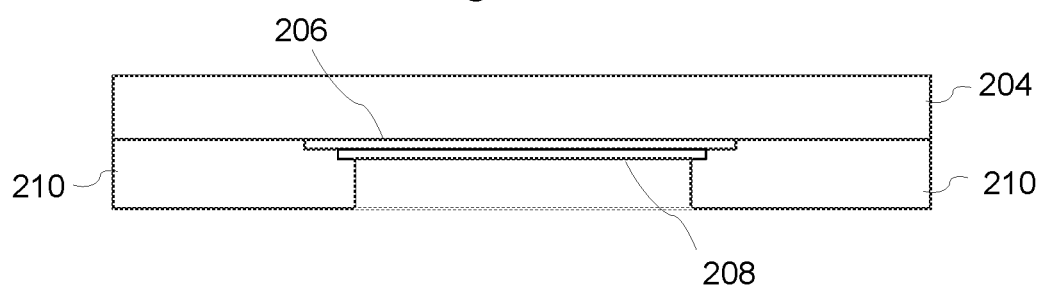

A dielectric layer 210 is formed on the substrate 204 using techniques including those known in the art. The dielectric layer 210 can included, but is not limited to, polymers such as polyimide, SU-8, KMPR, epoxy, and other insulating materials including ceramics and glass. As illustrated in FIG. 2d, the dielectric layer 210 is patterned to uncover at least a portion of the gold layer 208. The dielectric layer 210 is patterned, for some embodiments, using photolithography and etching techniques including those known in the art.

Figure 2E:
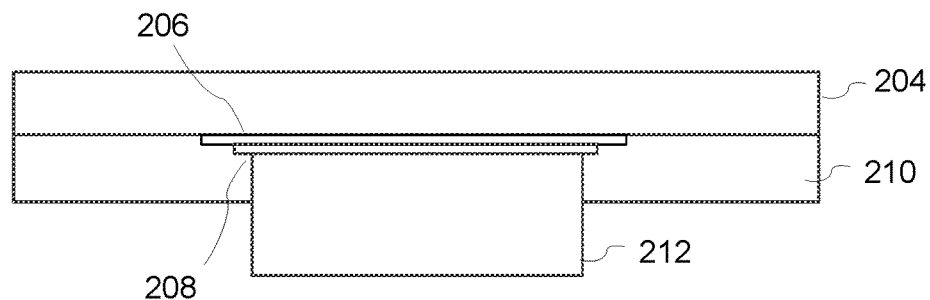

As illustrated in FIG. 2e, a metal layer 212 is formed. The metal layer is formed into one or more of any of traces and contacts as defined by the dielectric layer. For some embodiments, the metal layer is formed by depositing a metal within the pattern formed by the dielectric layer 210. The metal layer may be formed of copper, aluminum, alloys, and other metals. For some embodiments, the metal layer is formed using electroplating. Other embodiments include using sputtering, electroless plating, chemical vapor deposition, or other techniques including those known in the art to form the metal layer 212.

Figure 2F:
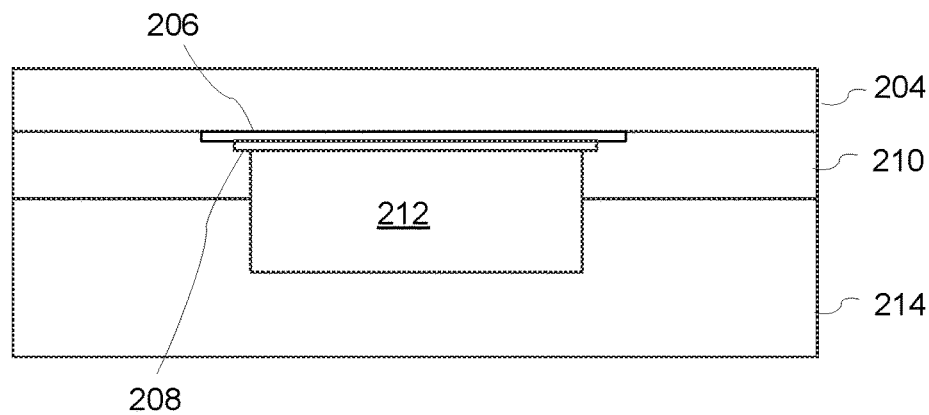
Figure 2G:
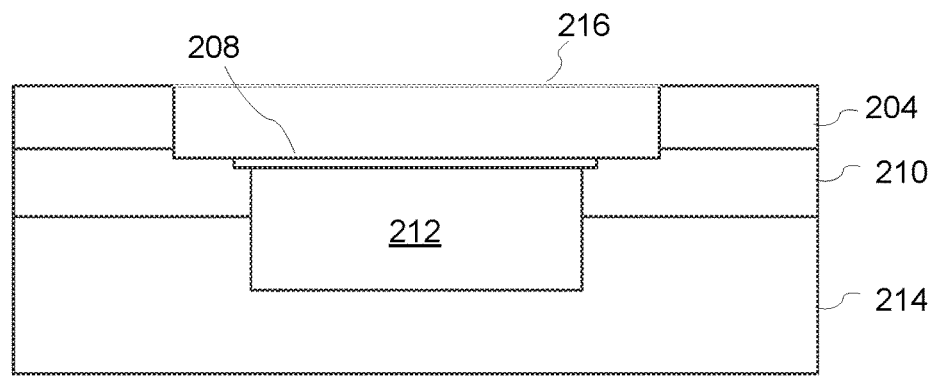

As illustrated in FIG. 2f, a covercoat layer 214 is formed over at least a portion of the dielectric layer 210 and the metal layer 212. The covercoat layer 214 can be formed by applying liquid material over the dielectric layer 212 and the metal layer 212 and curing the material. For other embodiments, the dielectric layer 212 is applied using techniques including, but not limited to, sputtering, chemical vapor deposition, thermal spray, and screen-printing techniques. The covercoat layer, according to come embodiments, could be patterned and etched to provide access to one or more portions of the metal layer 212 using techniques known in the art including those described herein. The covercoat layer 214 can be formed using materials including, but not limited to, polymers such as, polyimide, SU-8, KMPR, epoxy, and other insulating materials including ceramics and glass. As illustrated in FIG. 2g, a one or more openings 216 are formed in the substrate 204 to expose at least a portion of the gold layer 208 using etching techniques including those known in the art. The gold layer 208 acts as an etch stop to enable the ability to etch the substrate 204 without damaging a metal layer 212 formed on the opposite side of the substrate 204. This avoids yield reductions or degraded performance, for example of circuits formed from the metal layer, using other techniques to provide backside connection access to a metal layer.

One or more openings 216 are formed, according to some embodiments, by applying a dielectric layer over the substrate 204 and patterning the dielectric layer to expose one or more portions of substrate 204. The one or more portions of the substrate 204 that are exposed are etched using techniques including those described herein and those known in the art. For some embodiments, the dielectric layer formed over the substrate to create the one or more openings 216 is removed from the substrate 204 using techniques including those known in the art. For some embodiments, the opening 216 is large enough to enable the creation of an electrical contact to electrically couple at least a portion of the metal layer 212 in electrical contact with the portion of the gold layer 208 exposed by the opening. An electrical contact can be created using techniques known in the art including but not limited to, soldering, using conductive adhesive, and ultrasonically welding.

Figure 3A:
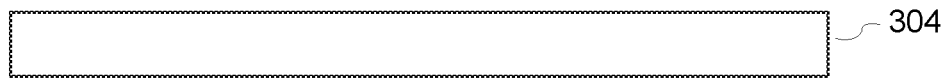
Figure 3C:
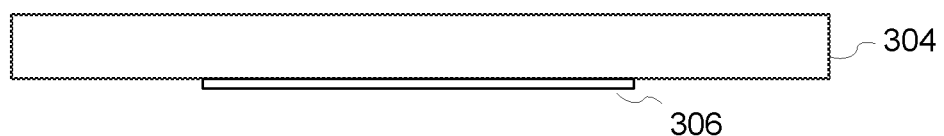
Figure 3C:
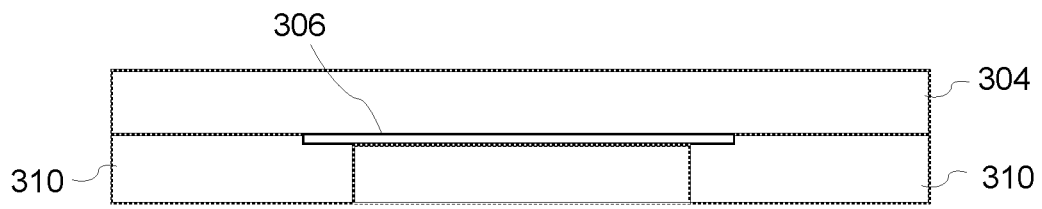

FIG. 3a-g illustrates a process for forming a backside connection access structure according to an embodiment. A substrate 304, such as those described herein, is cleaned using techniques such as those described herein as illustrated in FIG. 3a. As illustrated in FIG. 3b, an optional strike layer 306, such as those described herein, is formed on the substrate 304 using techniques such as those described herein. A dielectric layer 310, such as those described herein, is formed on the substrate 304 using techniques including those known in the art. As illustrated in FIG. 3c, the dielectric layer 310 is patterned to uncover at least a portion of the strike layer 306, if used, or a portion of the substrate when a strike layer 306 is not used. The dielectric layer 310 is patterned, for some embodiments, using techniques including those described herein.

Figure 3D:
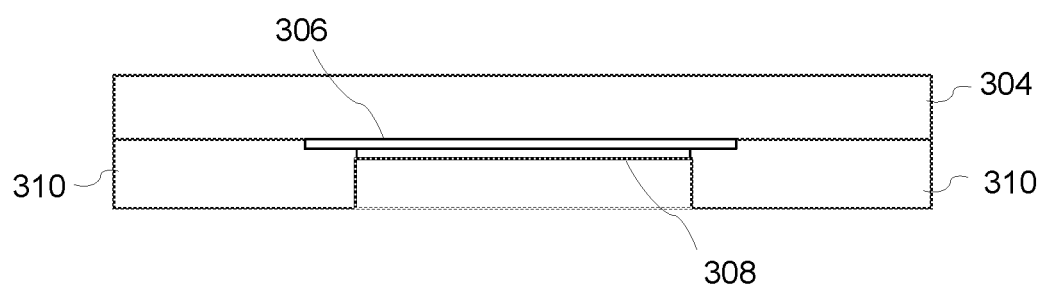
Figure 3E:
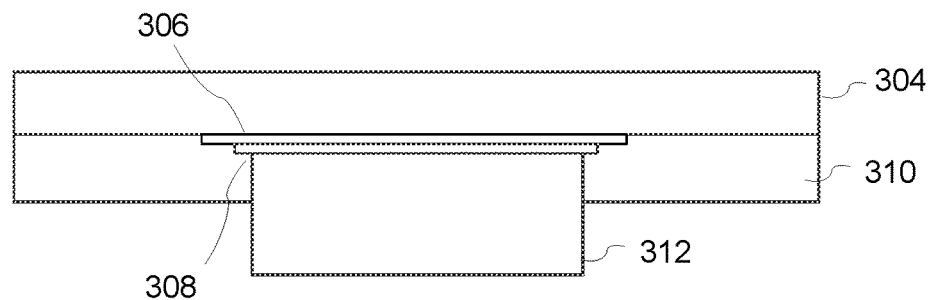

As illustrated in FIG. 3d, a gold layer 308 is formed on the strike layer 306 disposed on the substrate 304 using techniques such as those described herein. For embodiments without a strike layer 306, the gold layer 308 is formed on the substrate 304 using techniques such as those described herein. As illustrated in FIG. 3e, a metal layer 312 is formed using techniques such as those described herein. The metal layer 312 is formed into one or more of any of traces and contacts as defined by the dielectric layer. The metal layer may be formed of copper, aluminum, alloys, and other metals.

Figure 3F:
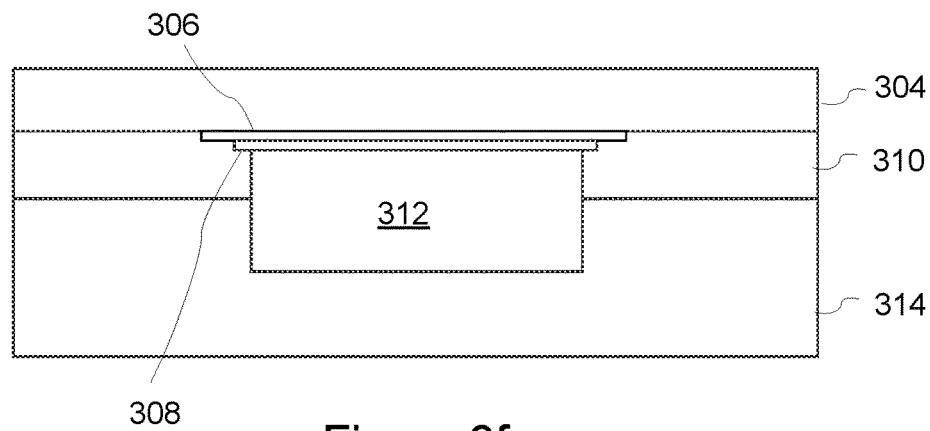
Figure 3G:
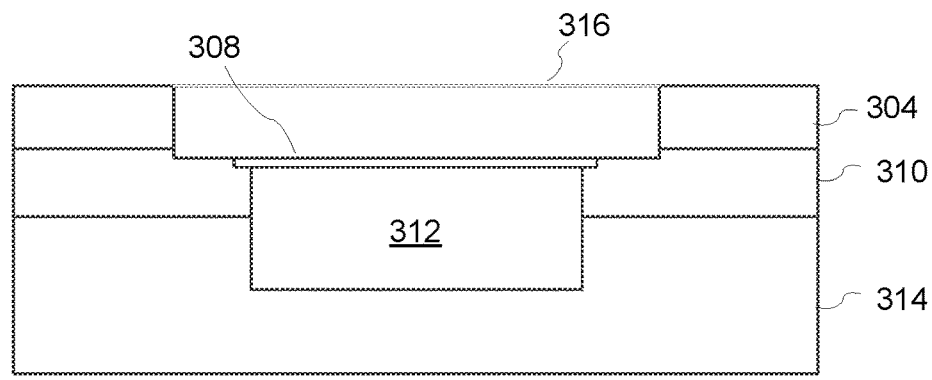

As illustrated in FIG. 3f, a covercoat layer 314 is formed over at least a portion of the dielectric layer 310 and the metal layer 312 using techniques such as those described herein. The covercoat layer 314 can be formed using materials such as those described herein. As illustrated in FIG. 3g, a one or more openings 316 are formed in the substrate 304 to expose at least a portion of the gold layer 308 using etching techniques including those known in the art. One or more openings 316 are formed using techniques such as those described herein. For some embodiments, the dielectric layer formed over the substrate to create the one or more openings 316 is removed from the substrate 304 using techniques including those known in the art. For some embodiments, the opening 316 is large enough to enable the creation of an electrical contact to electrically couple at least a portion of the metal layer 312 in electrical contact with the portion of the gold layer 308 exposed by the opening. An electrical contact can be created using techniques known in the art including but not limited to, soldering, using conductive adhesive, and ultrasonically welding.

Figure 4A:
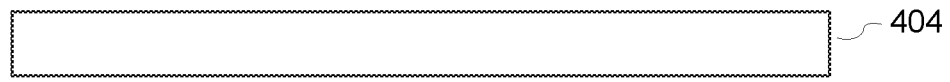
Figure 4C:
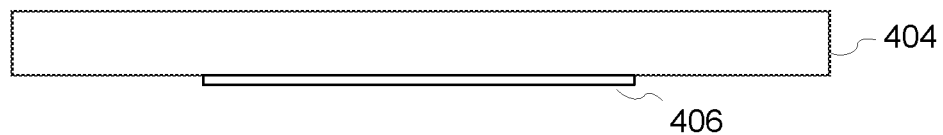
Figure 4C:
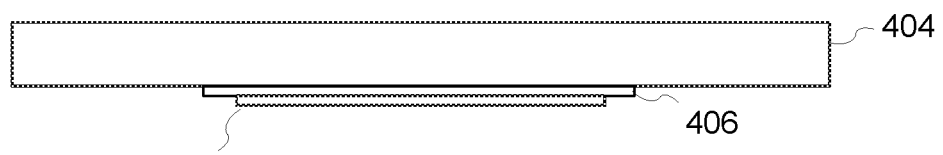
Figure 4D:

FIG. 4a-g illustrates a process for forming a backside connection access structure according to an embodiment. A substrate 404, such as those described herein, is cleaned using techniques such as those described herein as illustrated in FIG. 4a. As illustrated in FIG. 4b, an optional strike layer 406, such as those described herein, is formed on the substrate 404 using techniques such as those described herein. As illustrated in FIG. 4c, a gold layer 408 is formed on the strike layer 406 disposed on the substrate 404 using techniques such as those described herein. For embodiments without a strike layer 406, the gold layer 408 is formed on the substrate 404. As illustrated in FIG. 4d, a barrier layer 407 is formed on the gold layer 408 using techniques such as those described herein. For some embodiments, the barrier layer 407 is nickel layer. The barrier layer 407, according to some embodiments, isolates layers to prevent chemical reactions between layers and/or to increase adhesion of a layer disposed thereon.

Figure 4E:
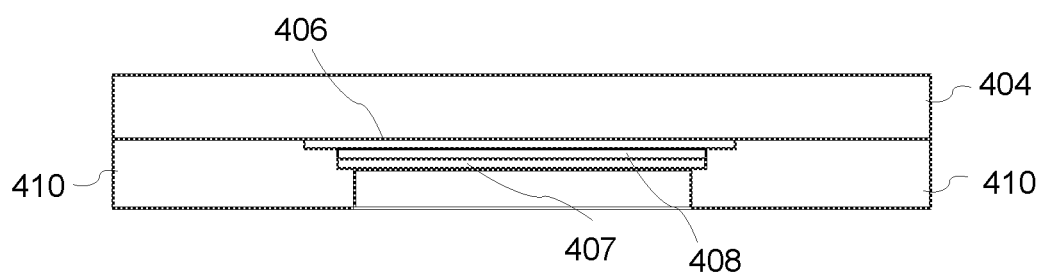

A dielectric layer 410, such as those described herein, is formed on the substrate 404 using techniques including those known in the art. As illustrated in FIG. 4e, the dielectric layer 410 is patterned to uncover at least a portion of the barrier layer 406. The dielectric layer 410 is patterned, for some embodiments, using techniques including those described herein.

Figure 4F:
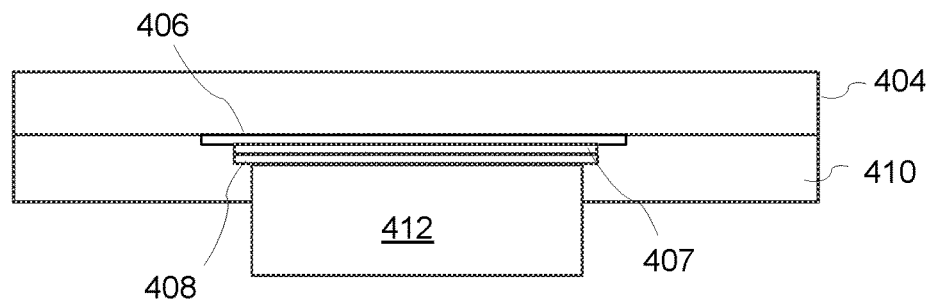
Figure 4G:
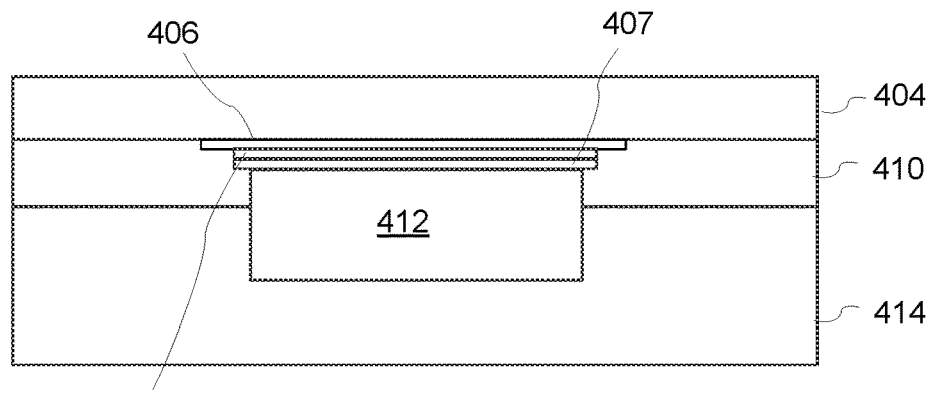
Figure 4H:
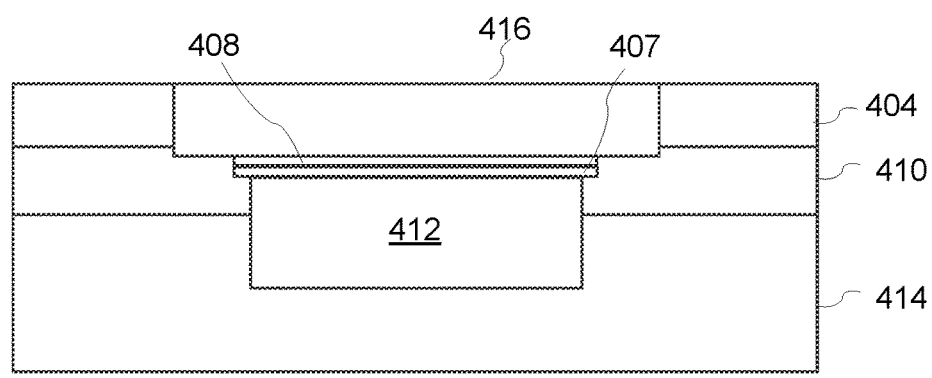

As illustrated in FIG. 4f, a metal layer 412 is formed using techniques such as those described herein. The metal layer 412 is formed into one or more of any of traces and contacts as defined by the dielectric layer. The metal layer may be formed of copper, aluminum, alloys, and other metals. As illustrated in FIG. 4g, a covercoat layer 414 is formed over at least a portion of the dielectric layer 410 and the metal layer 412 using techniques such as those described herein. The covercoat layer 414 can be formed using materials such as those described herein. As illustrated in FIG. 4h, a one or more openings 416 are formed in the substrate 404 to expose at least a portion of the gold layer 408 using etching techniques including those known in the art. One or more openings 416 are formed using techniques such as those described herein. For some embodiments, the dielectric layer formed over the substrate to create the one or more openings 416 is removed from the substrate 404 using techniques including those known in the art. For some embodiments, the opening 416 is large enough to enable the creation of an electrical contact to electrically couple at least a portion of the metal layer 412 in electrical contact with the portion of the gold layer 408 exposed by the opening. An electrical contact can be created using techniques known in the art including but not limited to, soldering, using conductive adhesive, and ultrasonically welding.

For some embodiments, such as those described herein, the gold layer is a finish layer formed of gold. For other embodiments, the finish layer is formed of metals, including, but not limited to, tin, solder, and other conductive materials.

The finish layer is formed using techniques such as those described herein for depositing a metal, for example, sputtering and patterning.

Although described in connection with these embodiments, those of skill in the art will recognize that changes can be made in form and detail without departing from the spirit and scope of the invention.

What is claimed is:

1. A device comprising:
    a metal substrate defining an opening;
    a metal layer within a dielectric layer having a portion of the metal layer disposed opposite the opening in the metal substrate; and
    a gold layer within the opening and disposed between the opening in the metal substrate and the metal layer within the opening such that the metal layer is not exposed within the opening in the metal substrate,
    the opening is configured to expose at least a portion of the gold layer.

2. The device of claim 1 comprising a strike layer configured initially between the metal substrate and the gold layer.

3. The device of claim 2, wherein the strike layer is a nickel layer.

4. The device of claim 1 comprising a barrier layer between the gold layer and metal layer.

5. The device of claim 4, wherein the barrier layer is a nickel layer.

* * * * *